(12) United States Patent
Seith et al.

(10) Patent No.: US 6,893,271 B2
(45) Date of Patent: May 17, 2005

(54) CIRCUIT BOARD ASSEMBLY, MAIN AND CONNECTOR BOARDS, AND CONNECTOR PINS FOR SAME

(75) Inventors: Warren A. Seith, Bethlehem, PA (US); Kevin J. Heinrichs, Lopatcong, NJ (US); Charles E. Pfeiffer, Phillipsburg, NJ (US); William M. Ball, Jr., Stockton, NJ (US)

(73) Assignee: Ingersoll-Rand Company, Woodcliff Lake, NJ (US)

( * ) Notice: Subject to any disclaimer, the term of this patent is extended or adjusted under 35 U.S.C. 154(b) by 0 days.

(21) Appl. No.: 10/681,733

(22) Filed: Oct. 8, 2003

(65) Prior Publication Data

US 2005/0079746 A1 Apr. 14, 2005

(51) Int. Cl.[7] .......................... H01R 12/00; H05K 1/00
(52) U.S. Cl. ...................................................... 439/79
(58) Field of Search ............................. 439/78–81, 53, 439/64–65, 43, 55, 59, 62, 629–630, 636

(56) References Cited

U.S. PATENT DOCUMENTS

| | | | |
|---|---|---|---|
| 3,993,936 A | 11/1976 | Meade et al. | |
| 4,109,298 A | 8/1978 | Hanni et al. | |
| 4,495,546 A | 1/1985 | Nakamura et al. | |
| 4,715,820 A | * 12/1987 | Andrews et al. | 439/59 |
| 4,723,925 A | 2/1988 | Orr, Jr. et al. | |
| 4,762,500 A | * 8/1988 | Dola et al. | 439/79 |
| 4,922,378 A | 5/1990 | Malhi et al. | |
| 5,031,072 A | 7/1991 | Malhi et al. | |
| 5,317,480 A | 5/1994 | Chandraiah et al. | |
| 5,484,965 A | 1/1996 | Woychik | |
| 5,644,475 A | 7/1997 | Woychik et al. | |
| 5,823,790 A | 10/1998 | Magnuson | |
| 5,853,297 A | 12/1998 | Moulton et al. | |
| 6,453,532 B1 | 9/2002 | Maiers et al. | |

FOREIGN PATENT DOCUMENTS

| | | |
|---|---|---|
| DE | 3138285 | 4/1983 |
| DE | 3919273 | 12/1990 |
| EP | 0804059 | 10/1987 |
| EP | 0599121 | 6/1994 |
| EP | 1035759 | 9/2000 |
| FR | 2608328 | 6/1988 |
| WO | WO 92/19024 | 10/1992 |
| WO | WO 96/24175 | 9/1996 |

OTHER PUBLICATIONS

"Good Crimps and How to Recognize Them" Article, Internet web pages for Molex–Good Crimps, Molex, Inc., Lisle, Illinois, Copyright 2000–2003 Molex, 22 pages.

"Miniature Adjustable Crimp Tools" Article, Internet web pages for Miniature Adjustable Crimp Tools, Daniels Manufacturing Corporation, Orlando, Florida, Copyright Daniels Manufacturing Corporation, Last modified: Feb. 12, 2003, 4 pages.

"Heat Shrink Tubing" Article, Internet web pages for Nelco Products Incorporated, Pembroke, Massachusetts, Copyright 1999–2003 Nelco Products Inc., 3 pages.

European Search Report dated Jan. 28, 2005 received in European Patent Application No. 04 25 6250 (4 pages).

* cited by examiner

Primary Examiner—Javaid H. Nasri
(74) Attorney, Agent, or Firm—Michael Best & Friedrich LLP (57) ABSTRACT

A circuit board assembly comprising a main board, a connector board, and connector pins. The main board has a first face and a second face and terminating in an edge having a mounting area, the mounting area comprising at least one mounting pad on at least one of the first and the second faces. The connector board having a first face and a second face and comprising at least one through hole between the first and second faces. At least one connector pin is disposed in the at least one through hole and having a portion extending beyond each of the first and second faces of the connector board, wherein the edge of the main board and the second face of the connector board are abutted and the portion of the connector pin extending beyond the second face of the connector board is attached to the at least one mounting pad.

12 Claims, 7 Drawing Sheets

CIRCUIT BOARD ASSEMBLY, MAIN AND CONNECTOR BOARDS, AND CONNECTOR PINS FOR SAME

FIELD OF THE INVENTION

The present invention relates to circuit board assemblies, and more particularly to a first circuit board and a second connector board that are connected together.

BACKGROUND OF THE INVENTION

Electronically controlled tools, such as DC tools, are typically designed to be driven from a controller using a cable between the controller and the tool to permit the tool to be moved freely inside of a workspace. The cable is typically a two-way conduit for providing motor power, signals, and other control lines between circuit boards and/or electrical components located onboard both the controller and the tool. In designing such tools, however, it is often desirable to minimize the length of the tool to facilitate fitting the tool into confined spaces. To help achieve this, one way of connecting the tool to a cable without adding length is to dress the cable directly into the tool without using a connector. However, this approach makes replacement of the cable, a high wear item, difficult. An alternative approach is to integrate one side of a connector at one end of the tool for connection to a mating connector of a cable. However, by integrating the connector, this approach undesirably adds significant length to the tool.

The foregoing illustrates limitations known to exist in present circuit board connector devices. Thus it is apparent that it would be advantageous to provide an alternative directed to overcoming one or more of the limitations set forth above. Accordingly an alternative circuit board connector assembly, which preferably includes both the circuit boards and connector pins described herein, are provided including the features more fully disclosed hereinafter.

SUMMARY OF THE INVENTION

According to the present invention, a circuit board assembly is provided having a main board, a connector board, and connector pins. The main board has a first face and a second face and terminating in an edge having a mounting area, the mounting area comprising at least one mounting pad on at least one of the first and the second faces. The connector board having a first face and a second face and comprising at least one through hole between the first and second faces. At least one connector pin is disposed in the at least one through hole and having a portion extending beyond each of the first and second faces of the connector board, wherein the edge of the main board and the second face of the connector board are abutted and the portion of the connector pin extending beyond the second face of the connector board is attached to the at least one mounting pad.

The foregoing and other aspects will become apparent from the following detailed description of the invention when considered in conjunction with the accompanying drawing figures.

DETAILED DESCRIPTION OF THE INVENTION

Figure 1:
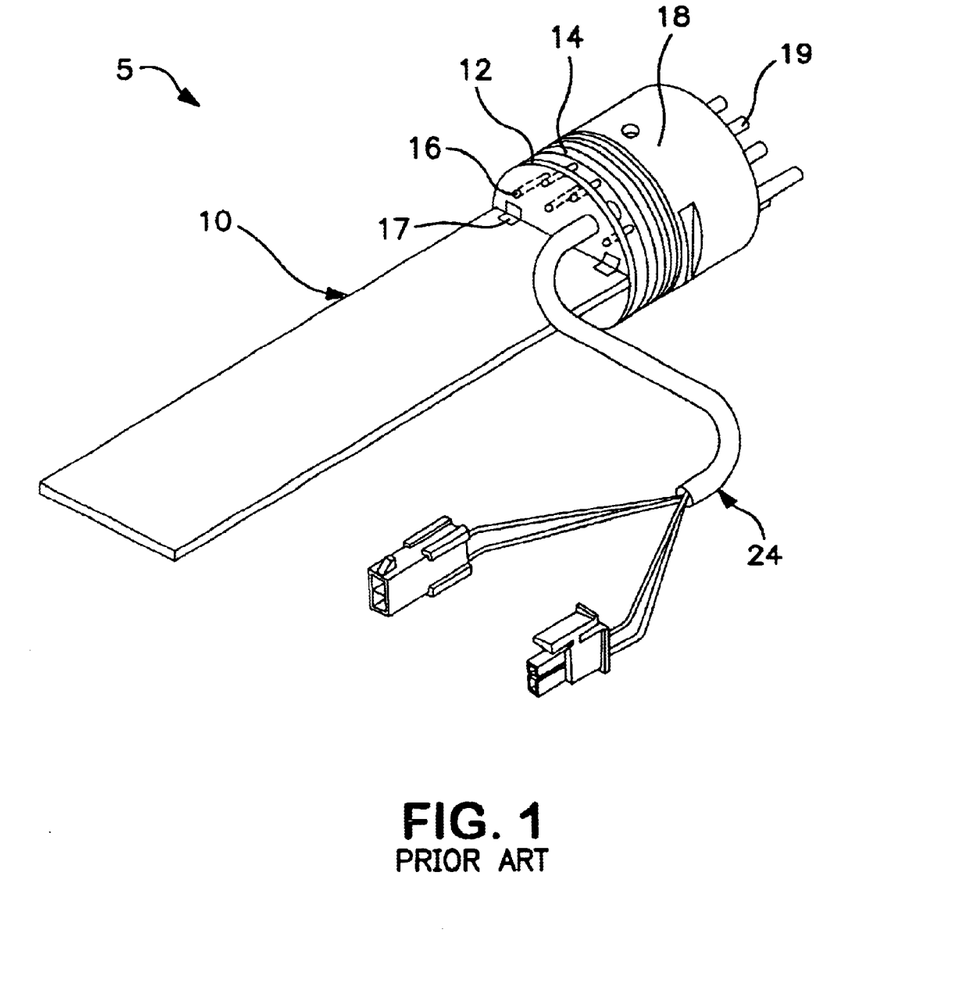
FIG. 1 is a perspective view of a conventional circuit board assembly according to the prior art.
Figure 2:
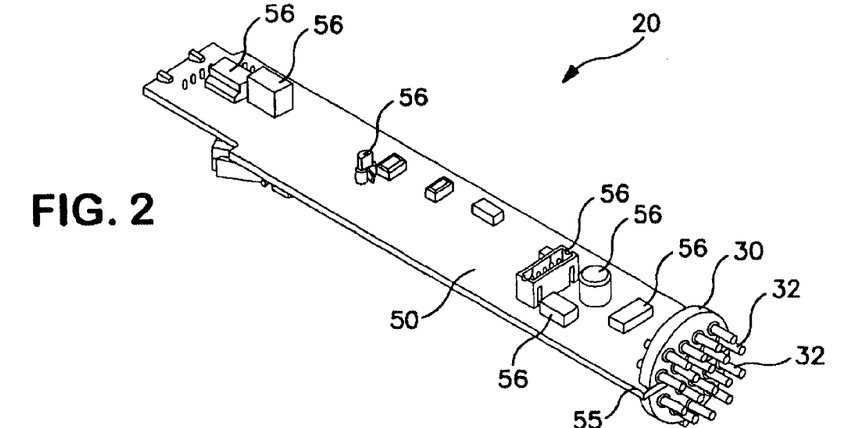
FIG. 2 is a perspective view of a circuit board assembly according to the present invention.
Figure 3:
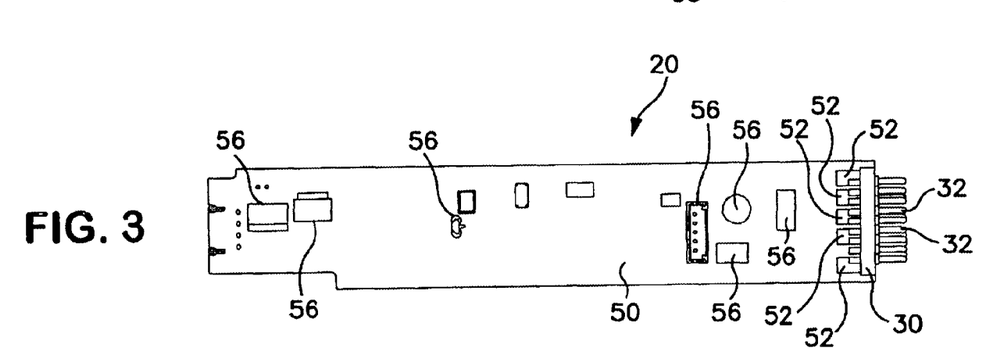
FIG. 3 is a top view of the circuit board assembly shown in FIG. 2.

Shown in FIG. 1 is a conventional circuit board assembly 5 that is typically installed into a housing of an electronically controlled tool and has an integral molded connector 18. Circuit board assembly 5 includes a main printed circuit board 10 that is orthogonally fitted into slots in a first connector board 12 and attached thereto via solder disposed between solder pads 17 located on each board. First connector board 12 is in turn connected to a second connector board 14 via board-to-board pins 16 which are electrically connected to connector pins 19. Second connector board 14 is provided to facilitate rerouting of trace connections between the connector pins 19. Connector pins 19 are partially embedded in molded connector 18 and extend outward for connection to a female receptacle of a connecting cable (not shown). Molded connector 18 is typically made of a thermoplastic resin that is molded around connector pins 19, board-to-board pins 16, and the connector sockets (not shown) that join them. Generally, electrical connections are established between connector pins 19 and electrical components that are located either on main board 10 via associated printed circuitry (not shown) or elsewhere in the tool housing via connecting cable 24.

Although generally acceptable, the conventional circuit board assembly 5 described above suffers from numerous drawbacks including the addition of significant length to the tool. Moreover, a plurality of parts and manufacturing steps are required to make the conventional connector assembly thus making it both labor intensive and more costly to manufacture. According to the present invention, a circuit board assembly is provided that is easily assembled to achieve an integrated connector that reduces both the number of component parts and the associated space required to house them.

Figure 4:
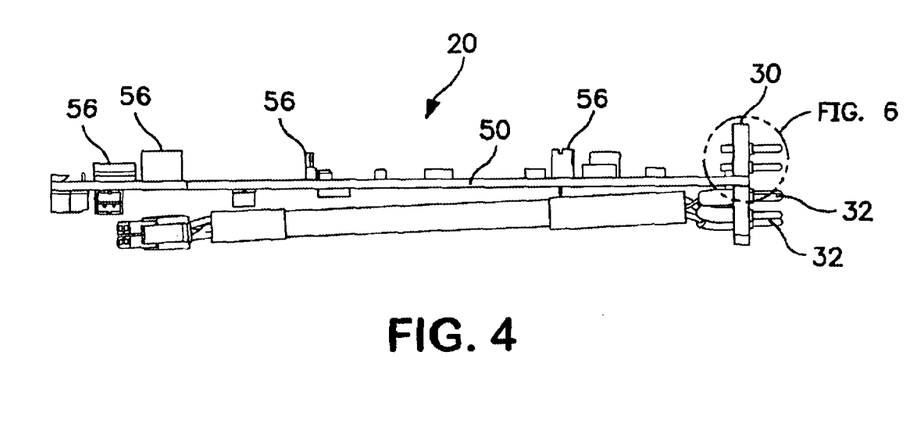
FIG. 4 is a side view of the circuit board assembly shown in FIG. 2.
Figure 5:
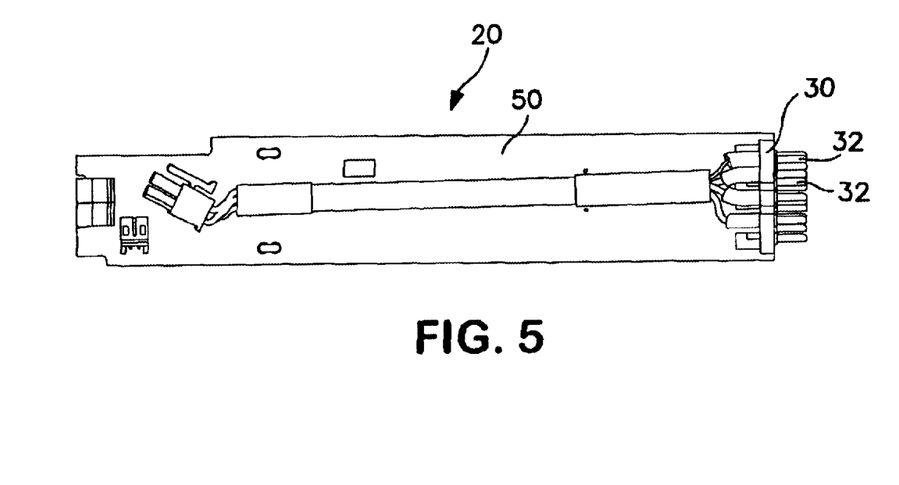
FIG. 5 is a bottom view of the circuit board assembly shown in FIG. 2.
Figure 6:
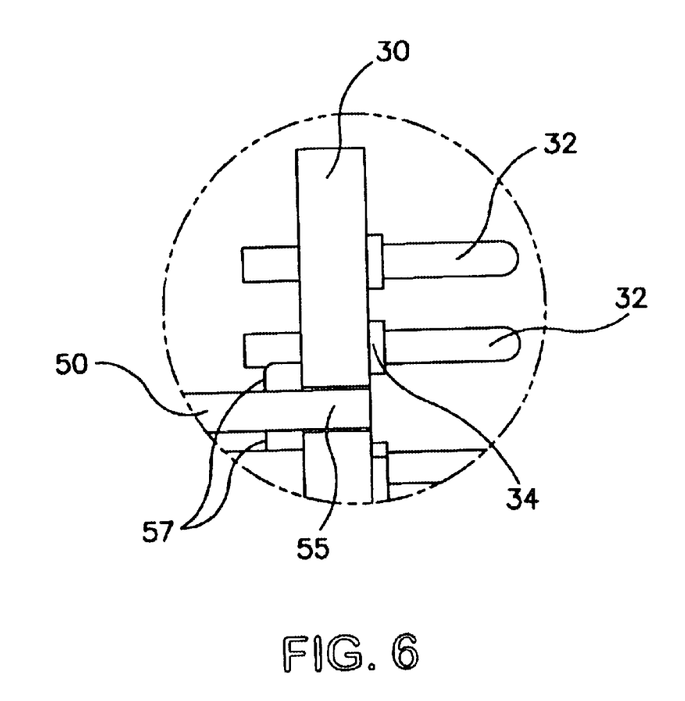
FIG. 6 is an enlarged view of the portion shown bounded by the dashed-dotted line in FIG. 4.

The invention is best understood by reference to the accompanying drawings in which like reference numbers refer to like parts. It is emphasized that, according to common practice, the various dimensions of the connectors and the associated component parts as shown in the drawings are not to scale and have been enlarged for clarity. Referring now to the drawings, shown in FIGS. 2–9, a circuit board assembly 20 according to the present invention is shown comprising a main board 50 and connector board 30 that are joined together, preferably, in an orthogonal orientation as shown in FIG. 4.

Main board 50 is a printed circuit board having a first face and a second face that include electronic and/or electrical components 56, such as integrated circuits, and associated circuitry. Connector board 30 has at least one through hole or a plurality of through holes 31 (shown in FIG. 9) in which is contained a corresponding at least one connector pin or a plurality of connector pins 32, respectively. As shown in the enlarged view of FIG. 6, preferably disposed circumferentially and located along the length of each of the connector pins 32 are flanges 34 for seating against the connector board 30 to prevent further forward axial motion once inserted into the plurality of holes 31. Preferably, connector pins 32; are hollow on one end to permit the insertion of conducting wires to be attached as described in detail below.

Figure 8:
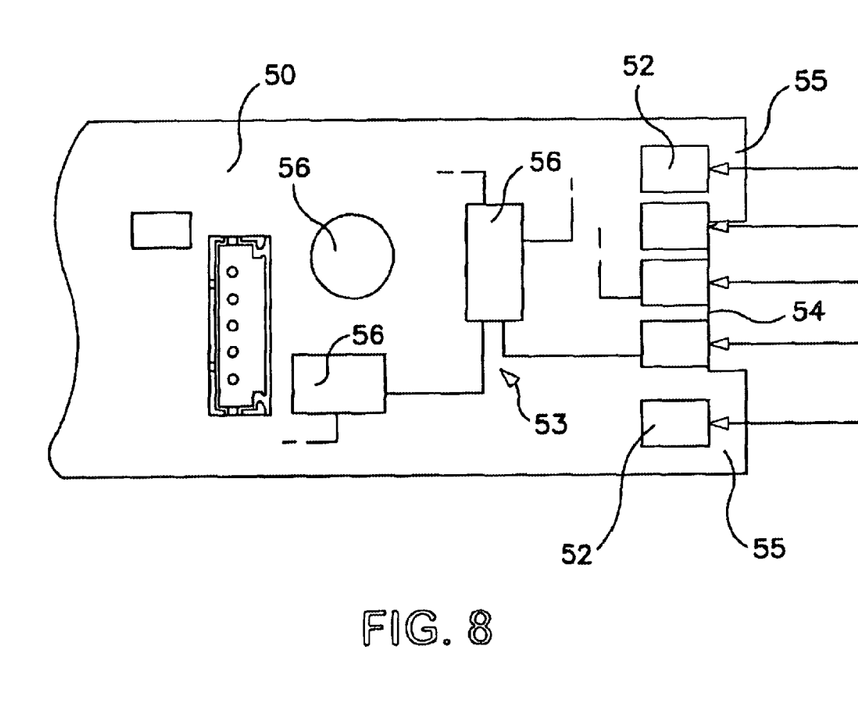
FIG. 8 is a partial planar view of the unassembled edge of a main board for a circuit board assembly according to the present invention.
Figure 9:
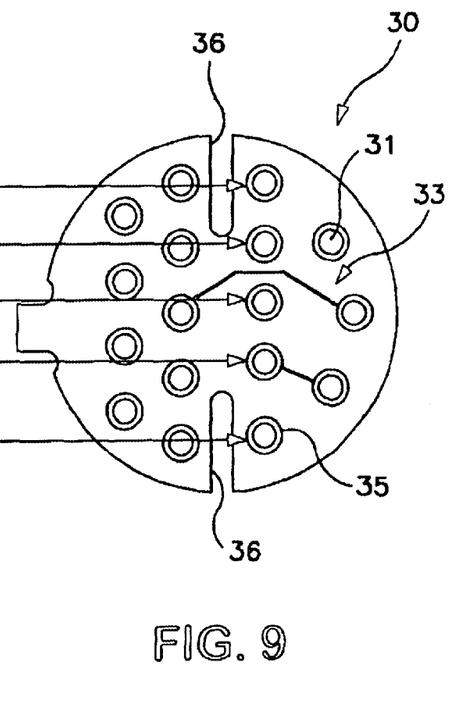
FIG. 9 is a front view of an unassembled connector board for a circuit board assembly according to the present invention.

As shown in FIG. 9, each of the plurality of holes 31 of connector board 30 is plated with metal around its periphery to form bonding rings 35. As discussed in detail below, connector pins 32 are soldered to bonding rings 35 achieving both the electrical interconnection of each pin to the bonding ring while mechanically preventing the pins from axially moving backward out of their respective holes. A printed circuit 33 (only part of the printed circuit being shown in FIG. 9) may be provided, as is known in the art, with traces on either or both sides of connector board 30 to provide various interconnections between the pins. Alternately to or in conjunction with the printed circuit, wire interconnects (not shown) may be used to connect the connector pins 32. Preferably, connector board 30 contains receiving slots 36 for receiving tab portions 55 located on both sides of a receiving notch 54 in the end of main board 50 that is to be joined. As seen best in FIGS. 3, 6, and 8, receiving notch 54 is configured to receive the thickness of connector board 30 so that the tab portions 55 are flush with the surface of the connector board 30 from which the connector pins 32 outwardly extend.

As shown in FIG. 8, at the rear edge of main board 50 on at least one and preferably both sides thereof, is at least one mounting pad that preferably is a plurality of electrical contact pads 52 which comprise part of the printed circuit 53 (only part of the printed circuit being shown). The printed circuit may be contained on both sides of the main board 50 with the two halves of the circuit being interconnected by plated through-holes (not shown), as is known in the art. Electronic and/or electrical components are mounted on the card, as is known in the art, with only a few exemplary components 56 being shown in the drawing.

As discussed in greater detail below, attachment of the main board 50 to the connector board 30 is achieved by soldering at least one connector pin 32 to a corresponding contact pad 52 after the tab portions 55 of main board 50 are inserted into the receiving slots 36 of connector board 30. As shown by the connecting arrows between FIGS. 8 and 9, this is accomplished by locating at least one hole 31 positioned on either or both sides of the main board 50 so that each is aligned with a corresponding contact pad 52. To achieve a secure bond between the main board and the connector board, it is preferred that a plurality of electrical contact pads 52 are provided on each side of main board 50 with a plurality of corresponding holes 31 being aligned in two rows between which receiving slots 36 are located. Connector board 30 is preferably a printed circuit board on which printed circuit traces and the electrical contact pads can be provided to achieve desired interconnection configurations between the connector pins 32 and connector pads 52 of main board 50. In this fashion, the connector pins that are used to mechanically secure the main board to the connector board may also serve the dual purpose of providing electrical connections between the boards.

Figure 7:
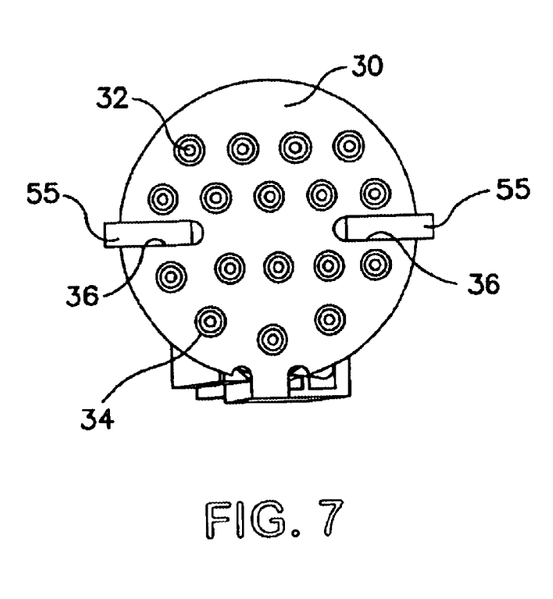
FIG. 7 is an end view of the circuit board assembly shown in FIG. 2.

To help prevent angular motion of the connector pins 32 while connecting and disconnecting a cable, it is preferred that the connector board 30 is provided in a thickness that is sufficient to support the connector pins. Generally, thicknesses of about one-eighth of an inch adequately accomplish this purpose. As shown in FIG. 7, receiving slots 36 are advantageously shaped to allow tab portions 55 to be easily inserted with, preferably, an interference fit being provided there between. Alternatively, receiving slots 36 can be configured for a looser (e.g., larger) fit than a size-on-size fit.

Figure 10:
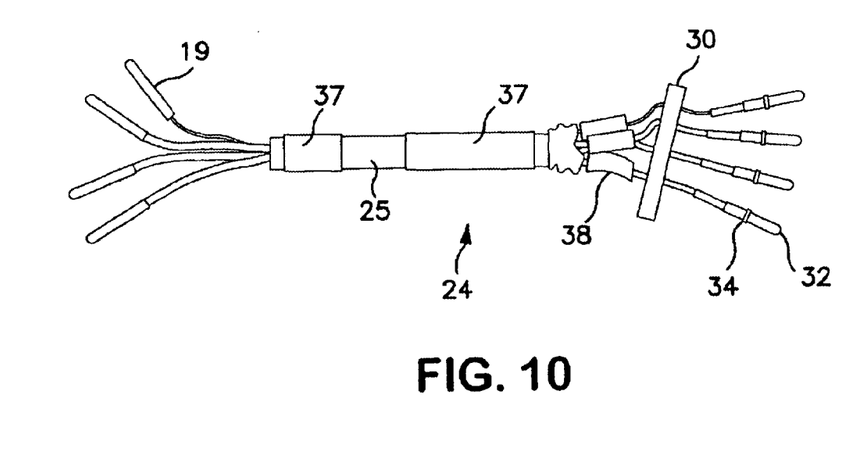
FIG. 10 is a perspective view of a connecting cable in the process of being assembled to a connector board of a circuit board assembly according to the present invention.
Figure 11:
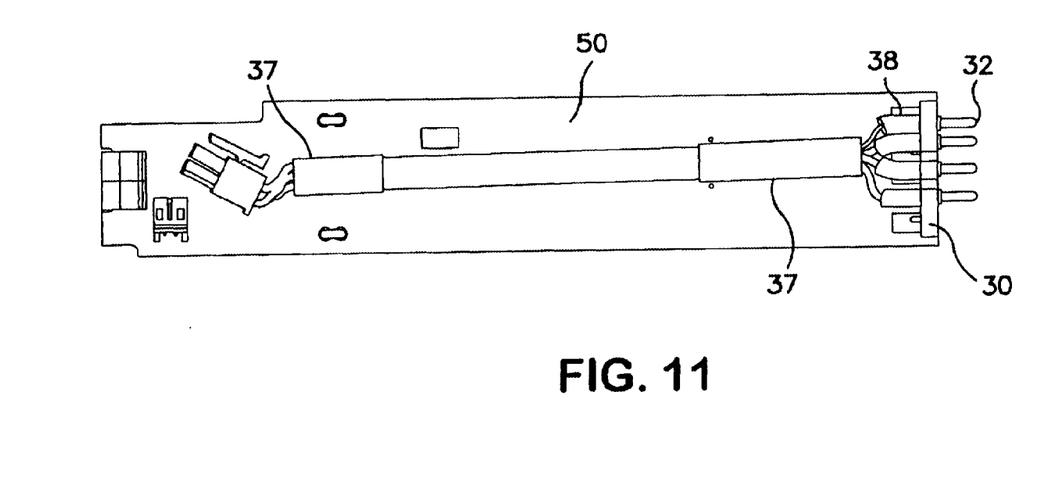
FIG. 11 is a bottom view of the connecting cable and connector board of FIG. 10 being attached to a main board of a circuit board assembly according to the present invention.

A typical assembly of a circuit board assembly according to the present invention will now be described. Turning to FIGS. 10–11, if connecting cables are to be included, the individual wires on one end are first stripped and then attached to conventional connector pins 19 by crimping the pins onto the individual wires. These conventional pins can include those such as such as connector pins available from Molex Inc. Lisle, Ill., to which a conventional pin connector is attached as shown in FIG. 11. As shown in FIG. 10 outer cable shield 25 of connecting cable 24 is then pulled away from the other end of the cable and the individual wires are similarly stripped and then inserted through the proper holes in connector board 30 for connection to the hollow ends of connector pins 32. Preferably, heat-shrinkable tubing 37 and 38, such as that available as NP203 polyolefin tubing from Nelco Products, Inc., Pembroke, Mass., is included both over the cable and the individual wires, respectively, as shown. Connector pins 32 are then crimped in similar fashion to connector pins 19 over the individual wire strands with the difference being that they include a circumferential flange as described above. Preferably, a crimping tool such as a Model M22520/2-01 crimp tool available from Daniels Manufacturing Corporation, Orlando, Fla. is used to crimp connector pins 32. Connector pins 32 are then pulled through connector board 30 until connector pin flanges 34 seat against a first face of the connector board. The connector pins 32 are then soldered in position to bonding rings 32 on a second face of the connector board 30 after which the shrink tubing 38 is slid over the pins and then shrunk. The outer cable shield 25 is then slid back toward connector board 30 and the heat shrink tubing 37 is then slid and shrunk over both ends of the cable shield. Tab portions 55 of main board 50 are then inserted into receiving slots 36 of connector board 30 so that the end of main board 50 is preferably flush with connector board 30 as shown.

Assembly of circuit board assembly 20 is then continued by inserting into the plurality of holes 31 additional connector pins 32 required to make the connections needed with a connector of a controller cable. As described above, the connector pins 32 are pulled through connector board 30 until connector pin flanges 34 seat against a first face of the connector board and then soldered in position to bonding rings 35 on a second face of the connector board 30. In the case of connector pins 32 that are aligned with and adjacent to contact pads 52, these pins are soldered directly to the contact pads to provide the mechanical connection between the connector board 30 and the main board 50. An electrical connection is also established by the solder 57 between the connector pins 32 and the contact pads 52 that may be used to connect the pins with other electrical components if electrical connections, such as those shown as printed circuit 53 in FIG. 8 and/or other wire interconnects, are made with contact pads 52. As described above, a printed circuit (such as that shown as printed circuit 33 in FIG. 9) and/or wire interconnects (not shown) may be used to connect the connector pins 32 hereby achieving various desired interconnections therebetween.

Figure 12:
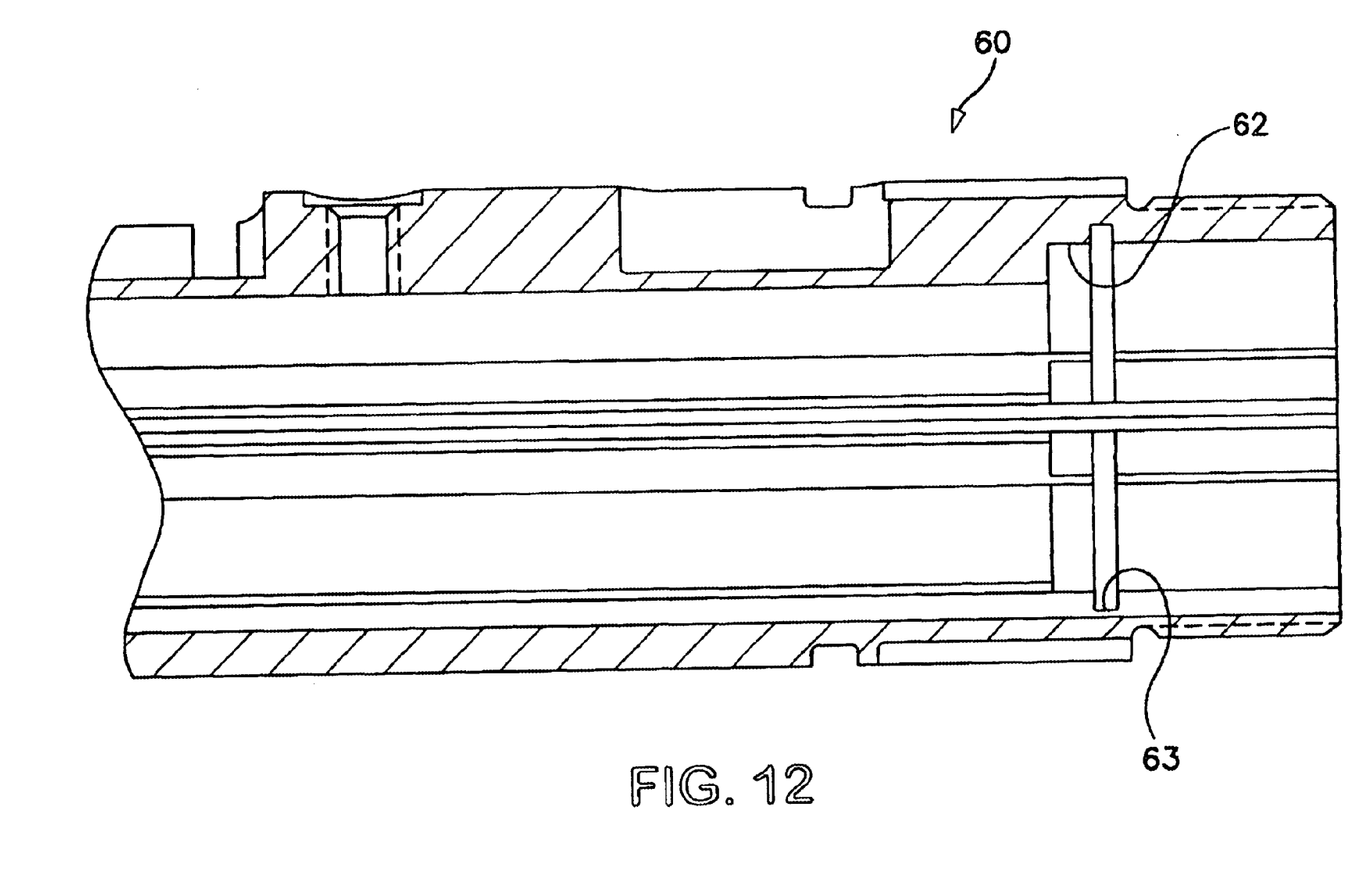
FIG. 12 is a partial sectional view of a tool housing configured to incorporate a circuit board assembly according to the present invention.

The completed circuit board assembly shown in FIGS. 2–7 produced thereby may then be inserted into a tool housing 60 such as that shown in FIG. 12, which preferably includes a shoulder 62 that captures the connector board 30 upon sliding it therein. Also preferred is the use of an O-ring groove 63 into which an O-ring is placed to help secure and seal the circuit board assembly 20 in tool housing 60.

Although described above with respect to use with electric tools, it is contemplated that the circuit board assembly according to the present invention may be incorporated into other electrical devices having pin connectors in which a robust mechanical assembly and compact design are desired. While embodiments and applications of this invention have been shown and described, it will be apparent to those skilled in the art that many more modifications are possible without departing from the inventive concepts herein described. For example, although shown with exemplary electrical components and circuitry it is to be understood that various other electrical components with different trace circuit configurations may be utilized. It is understood, therefore, that the invention is capable of modification and therefore is not to be limited to the precise details set forth. Rather, various modifications may be made in the details within the scope and range of equivalents of the claims without departing from the spirit.

What is claimed is:

1. A circuit board assembly comprising:
   a main board having a first face and a second face and terminating in an edge having a mounting area, the mounting area comprising at least one mounting pad on at least one of the first and the second faces;
   a connector board having a first face and a second face and comprising at least one through hole between the first and second faces; and
   at least one connector pin disposed in the at least one through hole and having a portion extending beyond each of the first and second faces of the connector board,
   wherein the edge of the main board and the second face of the connector board are abutted, the portion of the connector pin extending beyond the first face of the connector board is configured for electrical connection with a female electrical receptacle, and the portion of the connector pin extending beyond the second face of the connector board is attached to the at least one mounting pad.

2. The circuit board assembly according to claim 1 wherein the at least one connector pin further comprises a flange disposed circumferentially and located along the length of the pin that seats against the first side of the connector board.

3. The circuit board assembly according to claim 1 wherein the at least one mounting pad is a plurality of electrical contact pads located on one of the first side of the connector board, the second side of the connector board, or combinations thereof.

4. The circuit board assembly according to claim 3 wherein the at least one hole in the connector board is a plurality of holes and the at least one pin is a plurality of corresponding connector pins inserted in the plurality of holes.

5. The circuit board assembly according to claim 4 wherein the plurality of pins further comprise flanges disposed circumferentially and located along the length of the pins that seat against the first side of the connector board.

6. The circuit board assembly according to claim 4 wherein the plurality of connector pins include at least one row of pins aligned with and attached to the plurality of electrical contact pads on edge of the main board.

7. The circuit board assembly according to claim 6 wherein the portion of at least one row of pins extending beyond the second face of the connector board are attached to their corresponding electrical contact pads of the main board by a solder connection.

8. The circuit board assembly according to claim 1 wherein the edge of the main board adjacent the mounting area includes a slot with adjacent tab portions to receive the second face of the connector board.

9. The circuit board assembly according to claim 8 wherein the connector board comprises slots for receiving the tab portions of the main board.

10. The circuit board assembly according to claim 1 wherein the pins further comprise flanges disposed circumferentially and located along the length of the pins that seat against the first side of the connector board.

11. The circuit board assembly according to claim 1 wherein the main board is a printed circuit board having traces connecting at least one of the electrical contact pads to at least one electrical component located on the printed circuit board.

12. The circuit board assembly according to claim 1 wherein the connector board is a printed circuit board with traces that electrically connect the connecting pins.

* * * * *